(12) United States Patent
Jeon et al.

(10) Patent No.: US 8,704,148 B2
(45) Date of Patent: Apr. 22, 2014

(54) LIGHT-SENSING APPARATUS HAVING A CONDUCTIVE LIGHT-SHIELDING FILM ON A LIGHT-INCIDENT SURFACE OF A SWITCH TRANSISTOR AND METHOD OF DRIVING THE SAME

(75) Inventors: Sang-hun Jeon, Seoul (KR); I-hun Song, Seongnam-si (KR); Seung-eon Ahn, Hwaseong-si (KR); Chang-jung Kim, Yongin-si (KR); Young Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 214 days.

(21) Appl. No.: 13/358,862

(22) Filed: Jan. 26, 2012

(65) Prior Publication Data

US 2012/0267513 A1    Oct. 25, 2012

(30) Foreign Application Priority Data

Apr. 25, 2011    (KR) .................. 10-2011-0038442

(51) Int. Cl.
*H01J 40/14*        (2006.01)
(52) U.S. Cl.
USPC .................................. 250/214 R; 250/208.1
(58) Field of Classification Search
USPC ................ 250/214 R, 214.1, 208.1, 205; 257/290–292, 440; 348/294–311; 345/204, 211, 87–98
See application file for complete search history.

(56) References Cited

U.S. PATENT DOCUMENTS 6,952,022 B2    10/2005  Jang et al.
7,893,392 B2 *   2/2011  Takahashi .................. 250/208.1

FOREIGN PATENT DOCUMENTS

| JP | 02159061 A | 6/1990 |
| JP | 04321272 A | 11/1992 |
| JP | 06132510 A | 5/1994 |
| JP | 06140614 A | 5/1994 |
| KR | 19920013751 A | 7/1992 |
| KR | 100537376 B1 | 7/2000 |
| KR | 100525044 B1 | 9/2000 |
| KR | 100539661 B1 | 8/2003 |
| KR | 100867517 B1 | 3/2004 |
| KR | 20050015581 A | 2/2005 |
| KR | 20060069186 A | 6/2006 |

* cited by examiner

*Primary Examiner* — Que T Le
(74) *Attorney, Agent, or Firm* — Harness, Dickey & Pierce, P.L.C.

(57) ABSTRACT

According to an example embodiment, a light-sensing apparatus may include an array of light-sensing pixels, a first gate driver, and a signal output unit. Each of the light-sensing pixels may include a light sensor transistor configured to sense light, a switch transistor configured to output a light-sensing signal from the light sensor transistor, and a conductive light-shielding film on a light-incident surface of the switch transistor. The light sensor transistor and the switch transistor may have the same oxide semiconductor transistor structure. The first gate driver may be configured to provide a gate voltage and a negative bias voltage to each of the light-sensing pixels. The signal output unit may be configured to receive the light-sensing signal from each of the light-sensing pixels and output a data signal.

34 Claims, 9 Drawing Sheets

LIGHT-SENSING APPARATUS HAVING A CONDUCTIVE LIGHT-SHIELDING FILM ON A LIGHT-INCIDENT SURFACE OF A SWITCH TRANSISTOR AND METHOD OF DRIVING THE SAME

CROSS-REFERENCE TO RELATED APPLICATIONS

This application claims priority under 35 U.S.C. §119 to the benefit of Korean Patent Application No. 10-2011-0038442, filed on Apr. 25, 2011, in the Korean Intellectual Property Office, the disclosure of which is incorporated herein in its entirety by reference.

BACKGROUND

1. Field

Some example embodiments relate to light-sensing apparatuses and/or methods of driving the same, and more particularly, to light-sensing apparatuses in which a light-sensor transistor and a switch transistor in a light-sensing pixel may have the same oxide semiconductor transistor structure, and/or methods of driving the light-sensing apparatuses to improve the operating reliability of the light-sensing apparatuses.

2. Description of the Related Art

An oxide semiconductor transistor may be a transistor using an oxide semiconductor as a material of a channel. For example, an oxide semiconductor transistor may include a substrate, a gate disposed on the substrate, a gate insulating film disposed on the substrate and the gate to cover a periphery of the gate, an oxide semiconductor channel layer disposed on the gate insulating film, and a source and a drain disposed on both sides of the channel layer. Such an oxide semiconductor transistor may have a high sensitivity to light and may be used as a light-sensing element. The sensitivity to light may depend on the oxide semiconductor used in the channel layer. If an oxide semiconductor is used as a channel layer in an oxide semiconductor transistor, a threshold voltage and a drain current of the oxide semiconductor transistor may vary according to the wavelength and/or amount of incident light.

An oxide semiconductor transistor may be used instead of a photodiode as a light-sensing element. In addition, oxide semiconductor transistors may generate a larger photoelectric current than photodiodes. Accordingly, if the oxide semiconductor transistor is used as a light-sensing element, a capacitor that is generally used in a light-sensing pixel in order to accumulate charges generated due to a photoelectric current for a desired (and/or alternatively predetermined) period of time may be omitted. For example, the light-sensing pixel may include only the oxide semiconductor transistor for sensing light and a switch transistor for outputting data. Accordingly, the oxide semiconductor transistor may be used in various devices for sensing light. For example, the oxide semiconductor transistor may be used in an imaging device and/or an optical touch screen panel.

SUMMARY

Some example embodiments relate to light-sensing apparatuses in which a light sensor transistor and a switch transistor may have the same oxide semiconductor transistor structure.

Some example embodiments relate to methods of driving the light-sensing apparatuses to improve the operating reliability of the light-sensing apparatuses.

According to an example embodiment, a light-sensing apparatus includes an array of light-sensing pixels. Each of the light-sensing pixels includes a light sensor transistor configured to sense light, a switch transistor configured to output a light-sensing signal from the light sensor transistor, and a conductive light-shielding film that is on a light-incident surface of the switch transistor. The light-sensing apparatus may further include a first gate driver configured to provide a gate voltage and a negative bias voltage to each of the light-sensing pixels, and a signal output unit configured to receive a light-sensing signal from each of the light-sensing pixels, the signal output unit being configured to output a data signal.

The first gate driver may include a gate line that is connected to a gate electrode of the switch transistor in at least one of the light-sensing pixels, the gate line being configured to provide a gate voltage to the gate electrode. The first gate driver may further include a bias line that is connected to the conductive light-shielding film in at least one of the light-sensing pixels, the bias line being configured to and apply the negative bias voltage to the conductive light-shielding film.

The array of light-sensing pixels may include the plurality of light-sensing pixels arranged in columns and rows, The first gate driver may include a plurality of gate lines arranged in a row direction, and each of the gate lines may be configured to provide a gate voltage to the light-sensing pixels that are arranged along the same row.

The first gate driver may include a plurality of bias lines that are arranged in the row direction, and each of the bias lines may be configured to provide the negative bias voltage to the light-sensing pixels that are arranged along the same row.

The first gate driver may be configured to simultaneously provide the same negative bias voltage to all of the light-sensing pixels.

The light-sensing apparatus may further include a second gate driver that is configured to provide a reset signal to each of the light-sensing pixels.

The second gate driver may include a reset line that is connected to a gate electrode of the light sensor transistor in at least one of the light-sensing pixels. The reset line may be configured to provide a reset signal to at least one of the light-sensing pixels.

The array of light-sensing pixels may include the plurality of light-sensing pixels arranged in columns and rows. The second gate driver may include a plurality of reset lines that are arranged in a row direction, and each of the reset lines may be configured provide a reset signal to the light-sensing pixels that are arranged along the same row.

The light sensor transistor may include a channel film containing an oxide semiconductor material. The switch transistor may include a channel film containing an oxide semiconductor material.

The channel film of the light sensor transistor and the channel film of the switch transistor include the same oxide semiconductor material.

The oxide semiconductor material of at least one of the channel film of the light sensor transistor and the channel film of the switch transistor may include at least one of ZnO, InO, SnO, InZnO, ZnSnO, InSnO, and combinations thereof; and at least one of hafnium (Hf), zirconium (Zr), titanium (Ti), tantalum (Ta), gallium (Ga), niobium (Nb), vanadium (V), aluminum (Al), and stannum (Sn).

Each of the light-sensing pixels may include: a substrate; a first gate electrode and a second gate electrode that are at least partially on the substrate; a gate insulating film on the substrate to cover the first and second gate electrodes; a first channel film that is on the gate insulating film and the first gate electrode; a second channel film that is on the gate insulating film and the second gate electrode; a first source/drain electrode that is on a first side surface of the first channel film; a second source/drain electrode that is between a second side surface of the first channel film and a first side surface of the second channel film; a third source/drain electrode that is on a second side surface of the second channel film; and a transparent insulating layer that covers the first through third source/drain electrodes and the first and second channel films.

The light sensor transistor may include the first gate electrode, a first portion of the gate insulating film, the first channel film, the first source/drain electrode, a first portion of the second source/drain electrode, and a first portion the transparent insulating layer. The switch transistor may include the second gate electrode, a second portion of the gate insulating film, the second channel film, a second portion of the second source/drain electrode, a third source/drain electrode, and the transparent insulating layer.

The light-shielding film may be at least partially formed on the transparent insulating layer to cover the second channel film.

The first gate driver may be configured to adjust the negative bias voltage of at least one of the light-sensing pixels based on previously measured data about a relationship between an operating time of the light-sensing apparatus and a threshold voltage of the switch transistor, data about a reference threshold voltage of the switch transistor, and previously measured data about a relationship between a negative bias voltage applied to the light-shielding film and the threshold voltage of the switch transistor.

Each of the light-sensing pixels may include a common electrode connecting a channel film of the light sensor transistor to a channel film of the switch transistor.

Each of the light-sensing pixels may include a first gate electrode in the light sensor transistor, a channel film of the light sensor transistor on the first gate electrode, a second gate electrode in the switch transistor, and a channel film of the switch transistor between the second gate electrode and the conductive light-shielding film.

At least one of the channel film of the light sensor transistor and the channel film of the switch transistor may include a lower channel film, an upper channel film, and an intermediate channel film between the lower channel film and the upper channel film.

at least one of the lower channel film and the upper channel film may include an oxide semiconductor material, and at least one of a group III, IV, XIII, and XIV element.

The array of light-sensing pixels may include the light-sensing pixels arranged in columns and rows. The signal output unit may include a plurality of data lines arranged in a column direction. Each of the data lines may be connected to all of the light-sensing pixels arranged along the same column.

An example embodiment is related to a method of driving a light-sensing apparatus including a switch transistor configured to output a light-sensing signal from a light-sensing pixel, and a conductive light-shielding film disposed to face the switch transistor. The method may include operating the light-sensing apparatus, determining whether a threshold voltage of the switch transistor is lower than a reference threshold voltage, and if it is determined that the threshold voltage is lower than the reference threshold voltage, applying a negative bias voltage to the conductive light-shielding film to shift the threshold voltage of the switch transistor in a positive direction.

The negative bias voltage may be applied to the light-shielding film when a gate voltage is applied to the switch transistor, and the application of the negative voltage to the light-shielding film may be stopped when the application of the gate voltage to the switch transistor is stopped.

The light-sensing apparatus may include an array of light-sensing pixels that are arranged in columns and rows, and the gate voltage and the negative bias voltage may be sequentially provided to the switch transistors and the light-shielding films in the plurality of light-sensing pixels on a row-by-row basis, respectively.

A negative bias voltage may be continuously applied to the light-shielding film while the light-sensing apparatus operates.

The determining of whether the threshold voltage of the switch transistor is lower than the reference threshold voltage may include: monitoring an operating time of the light-sensing apparatus; predicting a threshold voltage of the switch transistor by referring to previously measured data about a relationship between the operating time of the light-sensing apparatus and the threshold voltage of the switch transistor; and comparing the predicted threshold voltage with a reference threshold voltage.

The determining of whether the threshold voltage of the switch transistor is lower than the reference threshold voltage may include: measuring a threshold voltage of the switch transistor while the light-sensing apparatus operates; and comparing the measured threshold voltage with a reference threshold voltage.

The measuring of the threshold voltage may include measuring a threshold voltage at preset time intervals.

The threshold voltage may be measured using a first gate driver of the light-sensing apparatus.

The applying of the negative bias voltage of the conductive light-shielding film to shift the threshold voltage of the switch transistor in the positive direction may include: adjusting a negative bias voltage by referring to previously measured data about a relationship between the negative bias voltage applied to the light-shielding film and the threshold voltage of the switch transistor.

The applying of the negative bias voltage to the conductive light-shielding film to shift the threshold voltage of the switch transistor in the positive direction may include: (a) increasing a negative bias voltage by a preset amount and applying the increased negative bias voltage to the conductive light-shielding film, (b) determining whether the threshold voltage of the switch transistor is lower than the reference threshold voltage, and repeating steps (a) and (b) until the threshold voltage of the switch transistor is equal to or higher than a reference threshold voltage.

The switch transistor may include a channel film containing an oxide semiconductor material.

The oxide semiconductor material may include at least one of ZnO, InO, SnO, InZnO, ZnSnO, InSnO, and combinations thereof, and at least one of Hf, Zr, Ti, Ta, Ga, Nb, V, Al, Ga, and Sn.

The applying a negative bias voltage to the conductive light-shielding film may includes applying a negative bias voltage to the conductive light-shielding film using a first gate driver of the light-sensing apparatus.

The light-sensing apparatus may include a plurality of switch transistors. The method may further include measuring a threshold voltage of some of the plurality of switch transistors while the light-sensing apparatus operates, and comparing the measured threshold voltages with at least one reference threshold voltage, and if it is determined that at least one of the measured threshold voltages is lower than the reference threshold voltage, applying a negative bias voltage to the conductive light-shielding film of at least one of the plurality of switch transistors to shift the threshold voltage of at least one of the plurality of switch transistor in a positive direction.

BRIEF DESCRIPTION OF THE DRAWINGS

These and/or other aspects of example embodiments will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1:
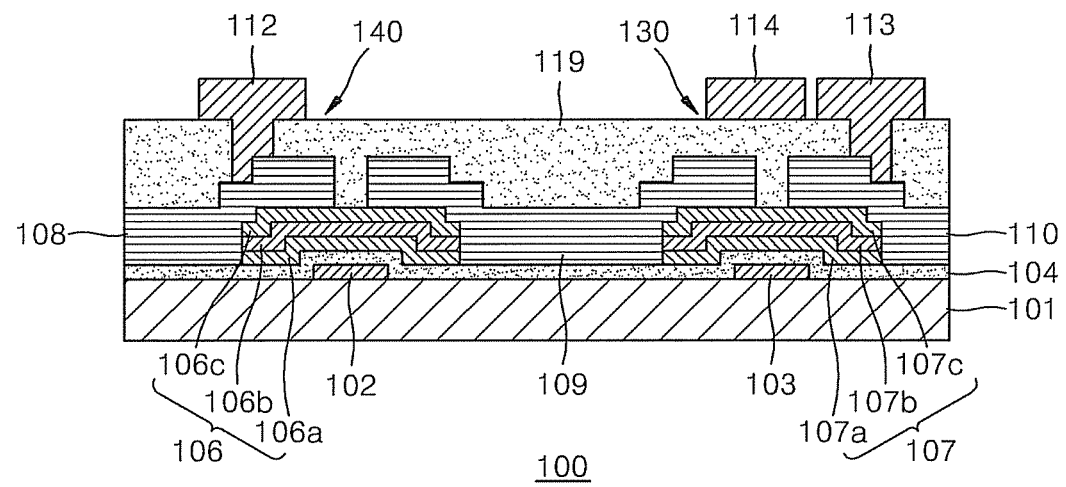
FIG. 1 is a cross-sectional view illustrating one light-sensing pixel of a light-sensing apparatus according to an example embodiment.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating one light-sensing pixel 100 of a light-sensing apparatus according to an example embodiment. Referring to FIG. 1, the light-sensing pixel 100 may include a switch transistor 130 and a light sensor transistor 140 formed on one substrate 101. As shown in FIG. 1, the switch transistor 130 and the light sensor transistor 140 may be connected in series to each other on the substrate 101. For example, the switch transistor 130 and the light sensor transistor 140 may include one common source/drain electrode, namely, a second source/drain electrode 109. Also, the switch transistor 130 and the light sensor transistor 140 may have the same light-sensitive oxide semiconductor transistor structure, but example embodiments are not limited thereto. However, in order to limit and/or prevent the switch transistor 130 from being affected by incident light, a light-shielding film 114 for blocking incident light may be further disposed on a light-incident surface of the switch transistor 130.

In detail, the light-sensing pixel 100 may include the substrate 101, a first gate electrode 102 and a second gate electrode 103 that are partially formed on the substrate 101, a gate insulating film 104 that is entirely coated on the substrate 101 and the first and second gate electrodes 102 and 103, a first channel film 106 that is formed on the gate insulating film 104 to face the first gate electrode 102, a second channel film 107 that is formed on the gate insulating film 104 to face the second gate electrode 103, first, second, and third source/drain electrodes 108, 109, and 110 that are formed on both sides of the first channel film 106 and the second channel film 107, a transparent insulating layer 119 that is entirely formed on the first, second, and third source/drain electrodes 108, 109, and 110 and the first and second channel films 106 and 107, a first wire 112 that passes through the transparent insulating layer 119 to be connected to the first source/drain electrode 108, a second wire 113 that passes through the transparent insulating layer 119 to be connected to the third source/drain electrode 110, and the light-shielding film 114 that is formed on the transparent insulating layer 119 to cover the second channel film 107 of the switch transistor 130.

In the light-sensing pixel 100 constructed as described above, the first gate electrode 102, the gate insulating film 104, the first channel film 106, the first and second source/drain electrodes 108 and 109, and the first wire 112 may constitute the light sensor transistor 140. Also, the second gate electrode 103, the gate insulating film 104, the second channel film 106, the second and third source/drain electrodes 109 and 110, and the second wire 113 may constitute the switch transistor 130. Accordingly, the gate insulating film 104 and the second source/drain electrode 109 are shared by the light sensor transistor 140 and the switch transistor 130. As shown in FIG. 1, the first source/drain electrode 108 is formed to cover a left portion of the first channel film 106 and a portion of the gate insulating film 104 located at a left side of the first channel film 106. Also, the second source/drain electrode 109 is formed to cover a right portion of the first channel film 106, a left portion of the second channel film 107, and a portion of the gate insulating film 104 located between the first channel film 106 and the second channel film 107. Also, the third source/drain electrode 110 may be formed to cover a right portion of the second channel film 107 and a portion of the gate insulating film 104 located at a right side of the second channel film 107.

The substrate 101 and the gate insulating film 104 may be formed of an insulating material. If the light-sensing apparatus is integrated into a display pixel of a display panel or is used as an optical touch screen panel attached to a surface of a display panel, the substrate 101 and the gate insulating film 104 may be formed of a transparent insulating material. For example, the substrate 101 may be formed of glass, and the gate insulating film 104 may be formed of a transparent insulating material such as $SiO_2$, but example embodiments are not limited thereto. However, if the light-sensing apparatus is used as a general imaging element, the substrate 101 and the gate insulating film 104 do not have to be transparent. Also, the first, second, and third source/drain electrodes 108, 109, and 110 may be formed of a conductive metal and/or a conductive metal oxide material. If the light-sensing apparatus is used as an optical touch screen panel, the first, second, and third source/drain electrodes 108, 109, and 110 may be formed of a transparent conductive material such as indium tin oxide (ITO), but example embodiments are not limited thereto. The transparent insulating layer 119 may be formed of a transparent insulating material such as $SiO_2$, but example embodiments are not limited thereto. Also, the first wire 112, the second wire 113, and the light-shielding film 114 may be formed of the same conductive material, for example, a metal, but example embodiments are not limited thereto. The materials for the first wire 112 and/or the second wire 113 may alternatively be formed of a conductive metal oxide. A thickness of the light-shielding film 114 may be greater than a skin depth of the material in order not to transmit light.

The first and second channel films 106 and 107 may be formed of an oxide semiconductor material sensitive to light. For example, the oxide semiconductor material may be an oxide semiconductor material such as ZnO, InO, SnO, InZnO, ZnSnO, or InSnO, or an oxide semiconductor material that includes a group III, IV, XIII, or XIV element, for example at least one of hafnium (Hf), zirconium (Zr), titanium (Ti), tantalum (Ta), gallium (Ga), niobium (Nb), vanadium (V), aluminum (Al), and stannum (Sn) is mixed to ZnO, InO, SnO, InZnO, ZnSnO, or InSnO, but example embodiments are not limited thereto. The first and second channel films 106 and 107 may each include a single oxide semiconductor layer, or may have a multi-layer structure as shown in FIG. 1. For example, in FIG. 1, the first and second channel films 106 and 107 have three-layer structures including lower channel films 106a and 107a, intermediate channel films 106b and 107b, and upper channel films 106c and 107c, respectively.

For example, the intermediate channel films 106b and 107b may be formed of ZnO, InO, SnO, InZnO, ZnSnO, or InSnO having a highest sensitivity to light from among the aforedescribed materials. The lower channel films 106a and 107a are threshold voltage adjusting layers for limiting and/or preventing a threshold voltage of a transistor from being lowered too much due to materials of the intermediate channel films 106b and 107b. For example, the lower channel films 106a and 107b may be formed of XZnO, XInO, XSnO, XInZnO, XZnSnO, or XInSnO (where X is at least one of Hf, Zr, Ti, Ta, Nb, V, Al, and Sn, but example embodiments are not limited thereto). A threshold voltage of a transistor may be adjusted to be close to 0 V according to materials and thicknesses of the lower channel films 106a and 107a. Also, the upper channel films 106c and 107c act as protective films for protecting the intermediate channel films 106b and 107b. For example, while the first, second, and third source/drain electrodes 108, 109, and 110 are formed, the upper channel films 106c and 107c may act as etch stoppers. Also, the upper channel films 106c and 107c may act as passivation films for reducing and/or preventing the intermediate channel films 106b and 107b from being deformed due to external materials. The upper channel films 106c and 107c may be formed of, for example, MZnO, MInO, MSnO, MInZnO, MZnSnO, or MIn-SnO (where M is at least one of Hf, Zr, Ti, Ta, Ga, Nb, V, Al, and Sn, but example embodiments are not limited thereto).

Figure 2:
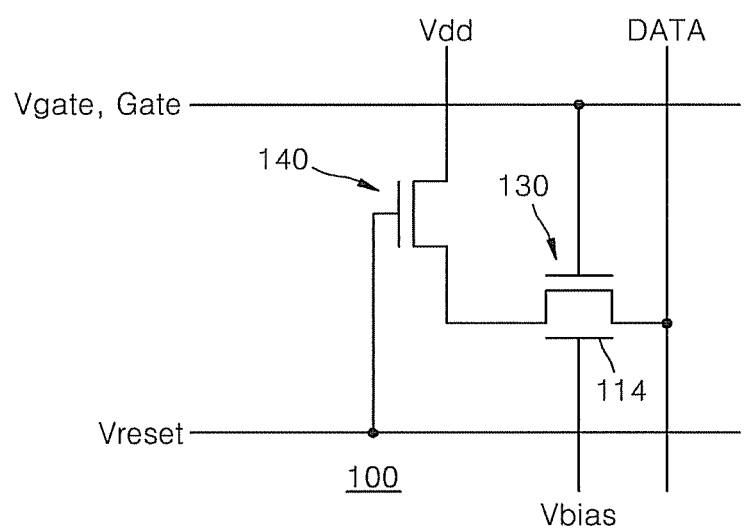
FIG. 2 is a circuit diagram of the light-sensing pixel of the light-sensing apparatus of FIG. 1.

FIG. 2 is a circuit diagram of the light-sensing pixel 100 of the light-sensing apparatus of FIG. 1. Referring to FIG. 2, the light-sensing pixel 100 may include the light sensor transistor 140 and the switch transistor 130, which are connected in series to each other. For example, the light sensor transistor 140 and the switch transistor 130 may be connected to each other through the second source/drain electrode 109 of FIG. 1. The light sensor transistor 140 acts as a light-sensing element for sensing incident light, and the switch transistor 130 acts as a switch for outputting a light-sensing signal. Also, as shown in FIG. 2, the light-sensing pixel 100 may further include a gate line Gate connected to the second gate electrode 103 of the switch transistor 130, a data line DATA connected to the third source/drain electrode 110 of the switch transistor 130, a driving voltage line Vdd connected to the first source/drain electrode 108 of the light sensor transistor 140, and a reset line Vreset connected to the first gate electrode 102 of the light sensor transistor 102. The Gate line may be configured to apply a gate voltage Vgate to the second gate electrode 103. The data line DATA may be electrically connected to the third source/drain electrode 110 through the second wire 113, and the driving voltage line Vdd is electrically connected to the first source/drain electrode 108 through the first wire 112. Also, in order to reduce and/or prevent a threshold voltage of the switch transistor 130 from being shifted, the light-sensing pixel 100 may further include a bias line Vbias for applying a negative bias voltage to the light-shielding film 114.

In the light-sensing pixel 100 constructed as described above, if a gate voltage Vgate is applied to the switch transistor 130 through the gate line Gate, the switch transistor 130 is turned on. Then, a current flows from the light sensor transistor 140 to the data line DATA through the switch transistor 130. In this case, the amount of current flowing from the light sensor transistor 140 to the data line DATA varies according to the intensity of light incident on the light sensor transistor 140. Accordingly, the intensity of light incident on the light sensor transistor 140 may be calculated by measuring the amount of current flowing through the data line DATA. Since the switch transistor 130 is turned off while no gate voltage is applied to the switch transistor 130, no current flows to the data line DATA.

Figure 3:
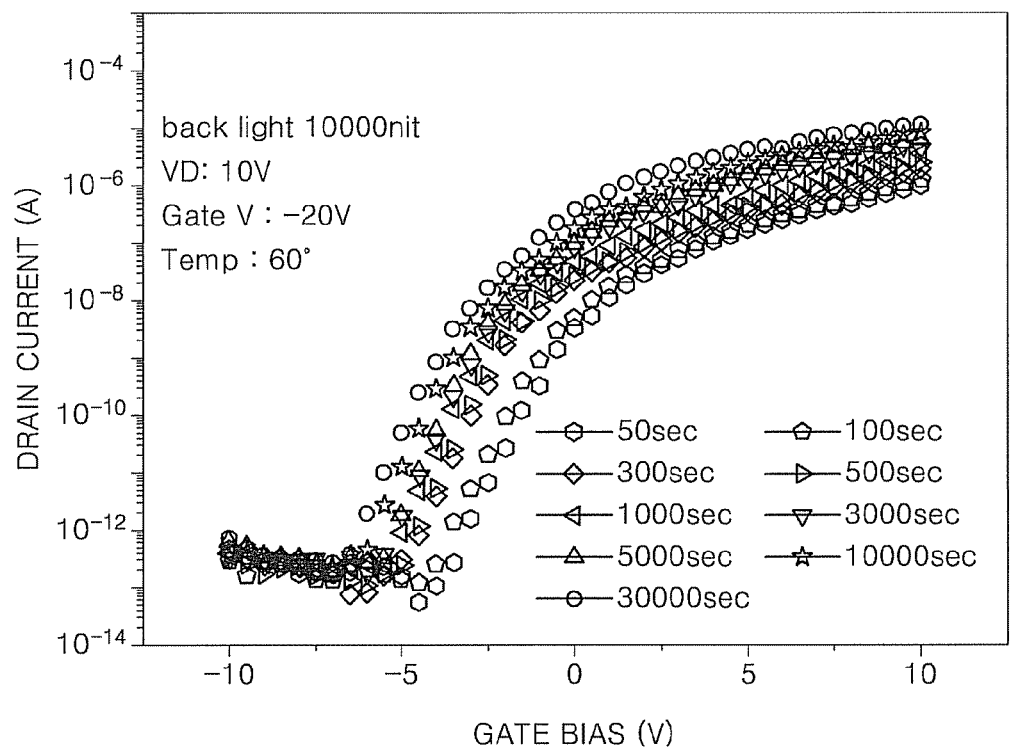
FIG. 3 is a graph illustrating a threshold voltage shift of an oxide semiconductor transistor over time.

In an oxide semiconductor transistor using an oxide semiconductor as a material of a channel, a threshold voltage may be shifted in a negative direction due to light and electrical stress over time. If such a shift occurs in the switch transistor 130 of the light-sensing pixel 100, the switch transistor 130 may not be turned on or off normally. For example, even when no gate voltage is applied to the switch transistor 130, the switch transistor 130 may be turned on, thereby reducing operating reliability of the light-sensing pixel 100. In particular, if the light-sensing apparatus is used as an optical touch screen panel, a threshold voltage shift may be accelerated due to light incident from a display panel (for example, light from a backlight unit of a liquid crystal display panel). FIG. 3 is a graph illustrating a threshold voltage shift of an oxide semiconductor transistor over time. For example, while a gate voltage of about −20 V and a driving voltage of about 10 V are applied to an oxide semiconductor transistor at a temperature of about 60° C., if light of about 10,000 nit or (cd/m$^2$) is emitted to the oxide semiconductor transistor, a threshold voltage of an oxide semiconductor is shifted in a negative direction over time as shown in FIG. 3.

Figure 4:
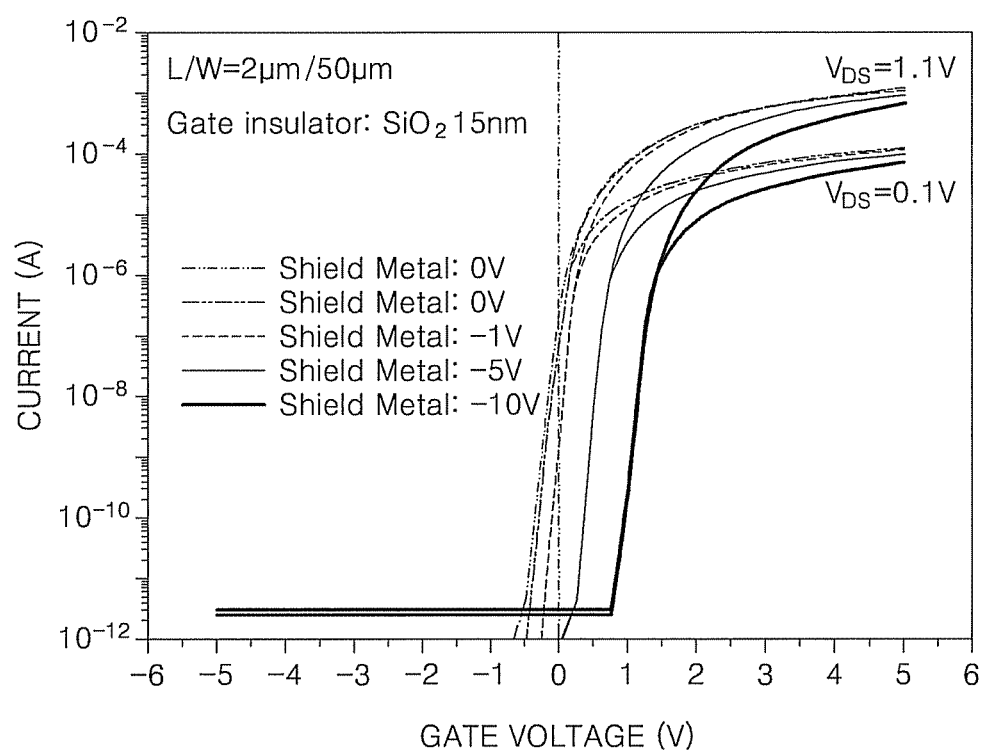
FIG. 4 is a graph illustrating an example where a threshold voltage of a switch transistor is shifted in a positive direction when a negative bias voltage is applied to a light-shielding film.

Accordingly, in order to reduce and/or prevent a threshold voltage shift in the switch transistor 130, a negative bias voltage may be applied to the light-shielding film 114. Referring to FIG. 1, this is because when a negative potential is formed over the second gate electrode 103, a voltage applied to the second gate electrode 103 needs to be increased in order to turn on the switch transistor 130 according to the energy band theory. FIG. 4 is a graph illustrating an example where a threshold voltage of the switch transistor 130 is shifted in a positive direction when a negative bias voltage is applied to the light-shielding film 114. Referring to FIG. 4, when a width and a length of the second gate electrode 103 are respectively about 2 μm and about 50 μm and a thickness of the gate insulating film 104 is about 15 nm, a threshold voltage of the switch transistor 130 is shifted in a more positive direction as a negative bias voltage applied to the light-shielding film 114 increases. In FIG. 4, $V_{DS}$ denotes a voltage between a drain and a source of the switch transistor 130. Accordingly, if a negative bias voltage applied to the light-shielding film 114 is increased by an amount of a threshold voltage of the switch transistor 130 shifted in a negative direction, the shift of the threshold voltage in the negative direction may be offset. As a result, a threshold voltage of the switch transistor 130 may be fixed by applying a negative bias voltage to the light-shielding film 114.

Figure 5:
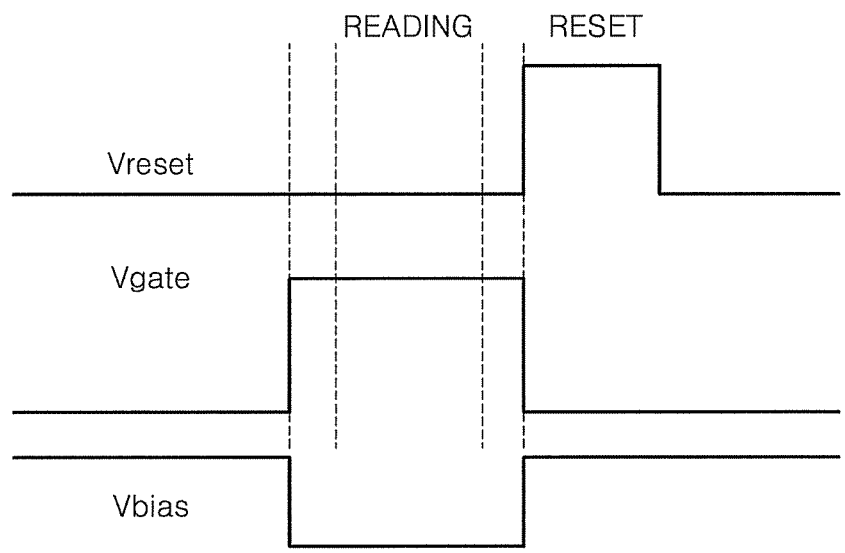
FIG. 5 is a timing diagram illustrating a method of driving the light-sensing apparatus, according to an example embodiment.

In the light-sensing apparatus including the light-sensing pixel 100 constructed as described above, there are two methods of applying a negative bias voltage to the light-shielding film 114. FIG. 5 is a timing diagram illustrating a method of driving the light-sensing apparatus, according to an example embodiment. For example, as shown in FIG. 5, a negative bias voltage Vbias may be applied to the light-shielding film 114 only while a gate voltage Vgate is applied to the switch transistor 130 in order to turn on the switch transistor 130. Referring to FIG. 5, during a READING operation, in order to read light-sensing data from the light-sensing pixel 100, a gate voltage Vgate is applied to the switch transistor 130 through the gate line Gate of the light-sensing pixel 100 for a desired (and/or alternatively predetermined) period of time. Also during a READING operation, a negative bias voltage Vbias is applied to the light-shielding film 114 of the switch transistor 130 to shift a threshold voltage of the switch transistor 130 in a positive direction. Accordingly, even though a threshold voltage of the switch transistor 130 is shifted in a negative direction due to light and electrical stress, since the threshold voltage of the switch transistor 130 is shifted in a positive direction again while a negative bias voltage is applied to the light-shielding film 114, the switch transistor 130 may be turned on at an originally designed gate voltage. Next, when the application of the gate voltage to the switch transistor 130 is stopped, the application of the negative bias voltage to the light-shielding film 114 is stopped at the same time. After the light-sensing data is read from the light-sensing pixel 100, as shown in FIG. 5, a positive reset signal Vreset is applied to the first gate electrode 102 of the light sensor transistor 140 through the reset line Vreset during a RESET operation. The reset signal is a signal for initializing the light sensor transistor 140 by removing charges accumulated on a boundary surface of the first channel film 106 of the light sensor transistor 140 while the light sensor transistor 140 is exposed to light. The light sensor transistor 140 may return to its early stage before being exposed to light due to the reset signal.

Figure 6:
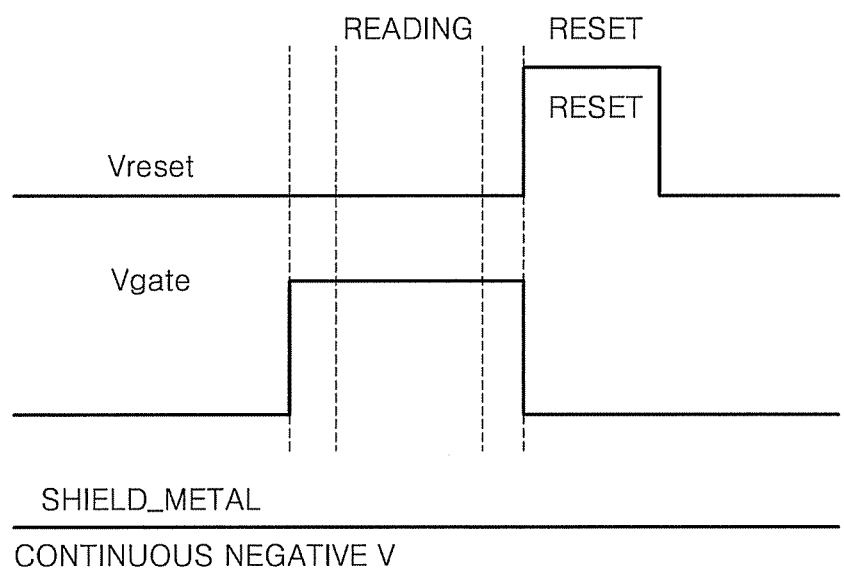
FIG. 6 is a timing diagram illustrating a method of driving the light-sensing apparatus, according to another example embodiment.

FIG. 6 is a timing diagram illustrating a method of driving a light-sensing apparatus, according to another example embodiment. As shown in FIG. 6, a negative bias voltage may be continuously applied to the light-shielding film 114 while the light-sensing apparatus operates. Referring to FIG. 6, a gate voltage and a reset signal are applied to the switch transistor 130 and the light sensor transistor 140, respectively, in the same manner as that described with reference to FIG. 5. However, the method of FIG. 6 is different from the method of FIG. 5 in that a negative bias voltage is applied to the light-shielding film 114 irrespective of whether a gate voltage is applied to the switch transistor 130.

Figure 7:
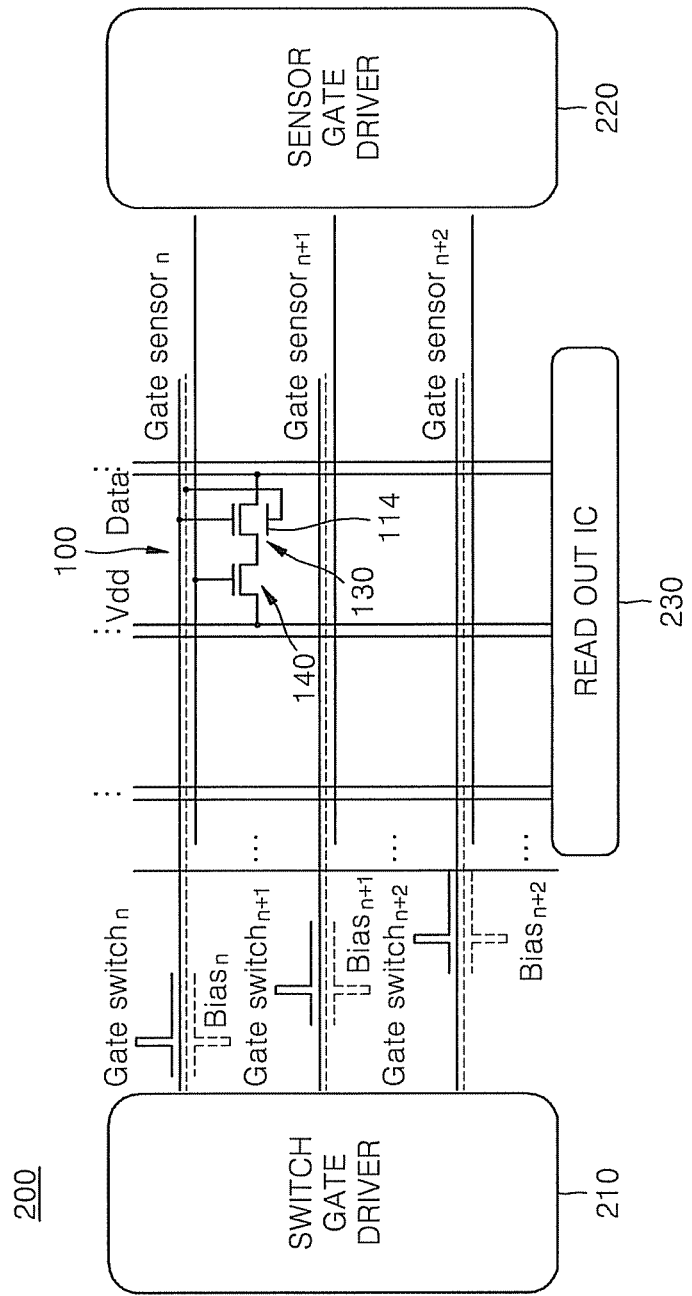
FIG. 7 is a block diagram illustrating a light-sensing apparatus driven by the method of FIG. 5, according to an example embodiment.

The light-sensing apparatus may include an array of the light-sensing pixels 100 and driving circuits for driving the plurality of light-sensing pixels 100. FIG. 7 is a block diagram illustrating a light-sensing apparatus 200 that may be driven by the method of FIG. 5, according to an example embodiment. Referring to FIG. 7, the light-sensing apparatus 200 may include an array of the light-sensing pixels 100 that sense incident light, a first gate driver 210 that sequentially provides a gate voltage and a negative bias voltage to each of the plurality of light-sensing pixels 100, a second gate driver 220 that sequentially provides a reset signal to each of the plurality of light-sensing pixels 100, and a signal output unit 230 that receives and outputs light-sensing data from each of the light-sensing pixels 100.

As shown in FIG. 7, the plurality of light-sensing pixels 100 constructed as described with reference to FIGS. 1 and 2 may be arranged in columns and rows. For example, the light-sensing pixels 100 may be arranged in an array including n rows and m columns. The first gate driver 210 individually activates each of the light-sensing pixels 100 and controls light-sensing data to be output from each of the light-sensing pixels 100. The first gate driver 210 may include a plurality of gate lines that are arranged in a row direction. Each of the gate lines is connected to all of the light-sensing pixels 100 that are arranged along the same row, particularly, to the second gate electrodes 103 of the switch transistors 130 in the light-sensing pixels 100. Also, the first gate driver 210 provides a negative bias voltage to each of the light-sensing pixels 100 in order to reduce and/or prevent a threshold voltage shift of the switch transistor 130. To this end, the first gate driver 210 may include a plurality of bias lines that are arranged in the row direction. Each of the bias lines is connected to the light-sensing pixels 100 that are arranged along the same row, particularly, to the light-shielding films 114 of the switch transistors 130 in the light-sensing pixels 100.

Also, the second gate driver 220 initializes the light-sensor transistor 140 in the light-sensing pixel 100 after reading light-sensing data. To this end, the second gate driver 220 may include a plurality of reset lines that are arranged in the row direction. Each of the reset lines is connected to all of the light-sensing pixels 100 that are arranged along the same row, particularly to the first gate electrodes 102 of the light sensor transistors 140 in the light-sensing pixels 100. The signal output unit 230 receives the light-sensing data generated by each of the light-sensing pixels 100 and outputs a signal. To this end, the signal output unit 230 may include a plurality of data lines that are arranged in a column direction. Each of the data lines may be connected to all of the light-sensing pixels 100 that are arranged along the same column, particularly, to the third source/drain electrodes 110 of the switch transistors 130 in the light-sensing pixels 100.

In the light-sensing apparatus 200 constructed as described above, the first gate driver 210 sequentially provides a gate voltage and a negative bias voltage as shown in FIG. 5 to the light-sensing pixels 100 through the plurality of gate lines and bias lines on a row-by-row basis. For example, after the first gate driver 210 simultaneously provides a gate voltage and a negative bias voltage to the light-sensing pixels 100 in an nth row, the first gate driver 210 simultaneously provides a gate voltage and a negative bias voltage to the light-sensing pixels 100 in an n+1th row. While the first gate driver 210 provides the gate voltage and the negative bias voltage to the light-sensing pixels 100 in the n+1th row, the second gate driver 220 may provide a reset signal to the light-sensing pixels 100 in the nth row as shown in FIG. 5.

Figure 8:
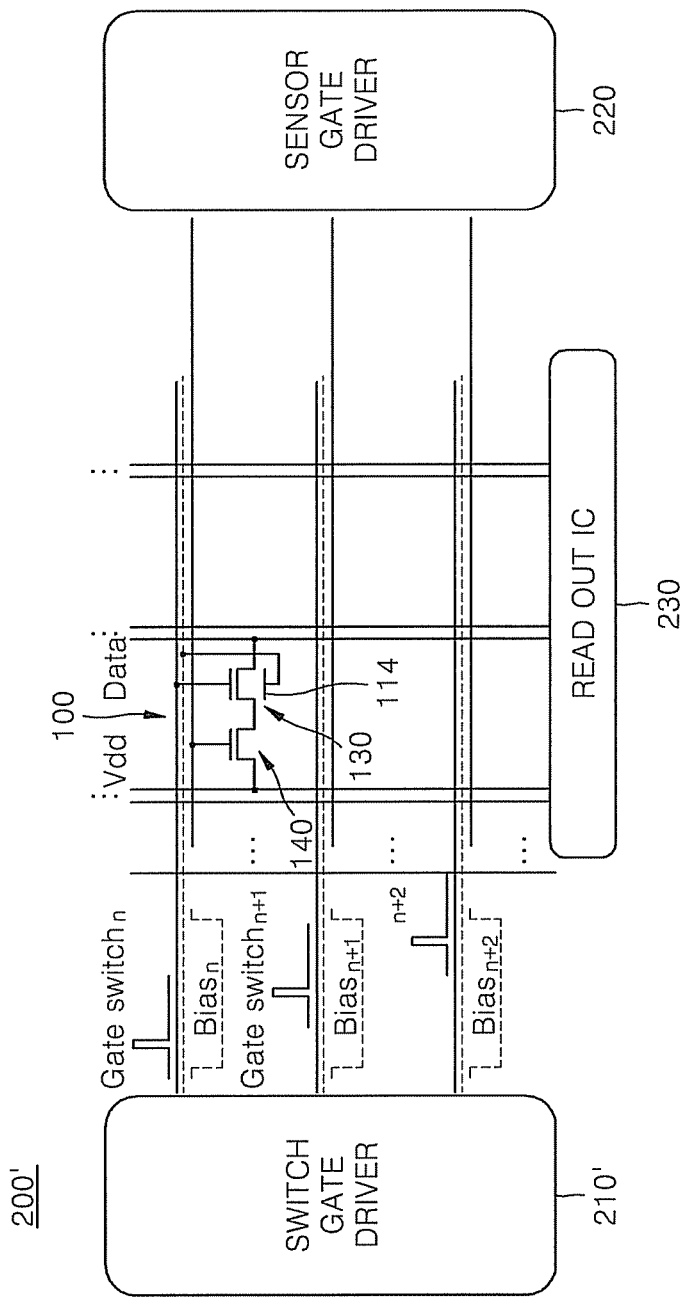
FIG. 8 is a block diagram illustrating a light-sensing apparatus driven by the method of FIG. 6, according to another example embodiment.

FIG. 8 is a block diagram illustrating a light-sensing apparatus 200' that may be driven by the method of FIG. 6, according to another example embodiment. Like the light-sensing apparatus 200 of FIG. 7, the light-sensing apparatus 200' of FIG. 8 may include an array of the light-sensing pixels 100 that sense incident light, a first gate driver 210' that provides a gate voltage and a negative bias voltage to the plurality of light-sensing pixels 100, a second gate driver 220 that provides a reset signal to the plurality of light-sensing pixels 100, and the signal output unit 230 that receives and outputs light-sensing data from each of the light-sensing pixels 100. The light-sensing apparatus 200' of FIG. 8 is different from the light-sensing apparatus 200 of FIG. 7 because the same negative bias voltage may be simultaneously applied to all of the light-sensing pixels 100. For example, the first gate driver 210' may simultaneously apply a negative bias voltage to all of the light-sensing pixels 100 irrespective of whether a gate voltage is applied to the switch transistor 130. Other elements and operations of the light-sensing apparatus 200' of FIG. 8 may be the same as those described with reference to FIG. 7.

A negative bias voltage applied to the light-shielding film 114 may vary according to an amount of a threshold voltage shift of the switch transistor 130. As described above, a threshold voltage of the switch transistor 130 including an oxide semiconductor may shift gradually in a negative direction. Accordingly, a negative bias voltage applied to the light-shielding film 114 may be increased to compensate for the shift in threshold voltage of the switch transistor 130. Also, since a threshold voltage shift of the switch transistor 130 may be very small at an early stage of operation of the light-sensing apparatus 200 or 200', a negative bias voltage does not have to be applied to the light-shielding film 114 from the early stage of operation. Also, a negative bias voltage applied to the light-shielding film 114 does not need to be adjusted every time, and only when a threshold voltage of the switch transistor 130 exceeds a certain limit, a negative bias voltage applied to the light-shielding film 114 may be adjusted.

Figure 9:
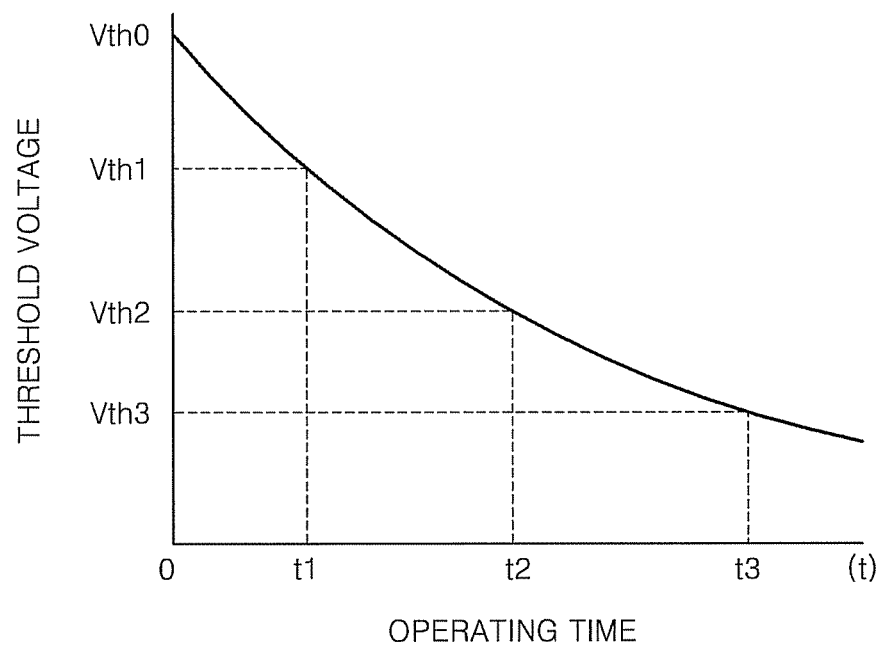
FIG. 9 is a graph illustrating a relationship between an operating time and a threshold voltage of a switch transistor.
Figure 10:
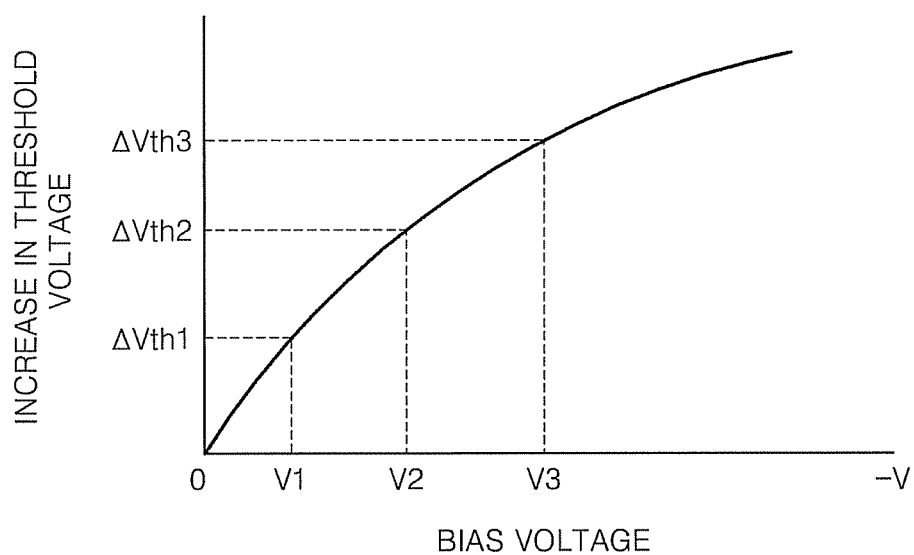
FIG. 10 is a graph illustrating a relationship between a negative bias voltage applied to the light-shielding film and a threshold voltage of the switch transistor.

For example, FIG. 9 is a graph illustrating a relationship between an operating time of the light-sensing apparatus 200 or 200' and a threshold voltage of the switch transistor 130. Referring to FIG. 9, a threshold voltage of the switch transistor 130 is maintained at an originally designed threshold voltage Vth0 at an early stage of operation. At a time t1, the threshold voltage of the switch transistor 130 is reduced to Vth1. Continuously, while the light-sensing apparatus 200 or 200' operates, at a time t2, the threshold voltage of the switch transistor 130 is reduced to Vth2, and at a time t3, the threshold voltage is reduced to Vth3. Also, FIG. 10 is a graph illustrating a relationship between a negative bias voltage applied to the light-shielding film 114 and a threshold voltage of the switch transistor 130. Referring to FIG. 10, when a negative bias voltage is V1, a threshold voltage of the switch transistor 130 is increased by ΔVth1, when the negative bias voltage is V2, the threshold voltage is increased by ΔVth2, and when the negative bias voltage is V3, the threshold voltage is increased by ΔVth3. Accordingly, when it is assumed that ΔVth1=Vth0−Vth1, ΔVth2=Vth0−Vth2, and ΔVth3=Vth0−Vth3, a bias voltage of V1 may be applied to the light-shielding film 114 at the time t1, a bias voltage of V2 may be applied to the light-shielding film 114 at the time t2, and a bias voltage of V3 may be applied to the light-shielding film 114 at the time t3. A threshold voltage of the switch transistor 130 may be constantly maintained by adjusting a negative bias voltage applied to the light-shielding film 114 in this way.

Figure 11:
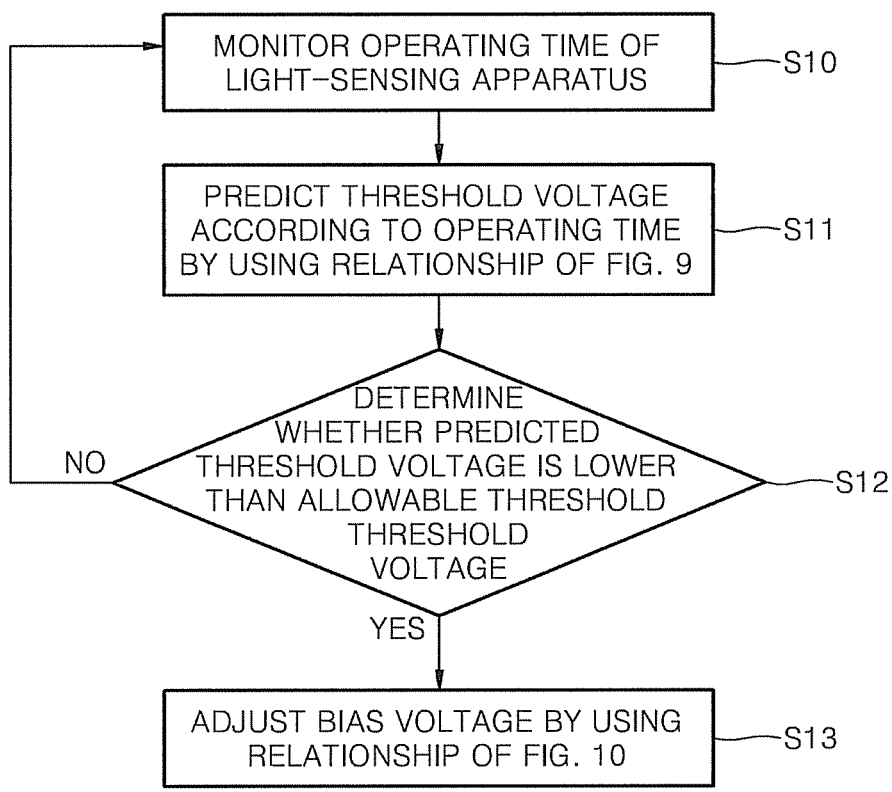
FIG. 11 is a flowchart illustrating a method of adjusting a bias voltage to apply an appropriate negative bias voltage to the light-shielding film, according to an example embodiment.

FIG. 11 is a flowchart illustrating a method of adjusting a bias voltage to apply appropriate negative bias voltage to the light-shielding film 114, according to an example embodiment. Referring to FIG. 11, when the light-sensing apparatus 200 or 200' operates, in operation S10, an operating time of the light-sensing apparatus 200 or 200' is monitored in real time. Operation S11 may be performed by the first gate driver 210 or 210' of the light-sensing apparatus 200 or 200'. In operation S11, a threshold voltage of the switch transistor 130 is predicted by using a relationship between the operating time of the light-sensing apparatus 200 or 200' and a threshold voltage of the switch transistor 130, as shown in FIG. 9. A relationship between the operating time of the light-sensing apparatus 200 or 200' and the threshold voltage of the switch transistor 130 may be measured in advance through an experiment. Measured data may be stored in a memory (not shown) in the first gate driver 210 or 210'. The first gate driver 210 or 210' may predict a threshold voltage of the switch transistor 130 at a current time by referring to related data stored in the memory.

In operation S12, it is determined whether the predicted threshold voltage of the switch transistor 130 is out of an allowable range. For example, data about a reference threshold voltage may be stored in the memory of the first gate driver 210 or 210'. The first gate driver 210 or 210' compares the predicted threshold voltage with the reference threshold voltage. If the predicted threshold voltage is lower than the reference threshold voltage, the method proceeds to operation S13. In operation S13, a negative bias voltage applied to the light-shielding film 114 is increased. If the predicted threshold voltage is within the allowable range, the negative bias voltage applied to the light-shielding film 114 is maintained. For example, referring to FIGS. 9 and 10, if the operating time of the light-sensing apparatus 200 or 200' does not pass the time t0, the negative bias voltage applied to the light-shielding film 114 is maintained at 0 V. When the operating time of the light-sensing apparatus 200 or 200' reaches the time t1, the first gate driver 210 or 210' increases the negative bias voltage applied to the light-shielding film 114 to V1. To this end, previously measured data about a relationship between the negative bias voltage applied to the light-shielding film 114 and the threshold voltage of the switch transistor 130 may be stored in the memory of the first gate driver 210 or 210'.

Figure 12:
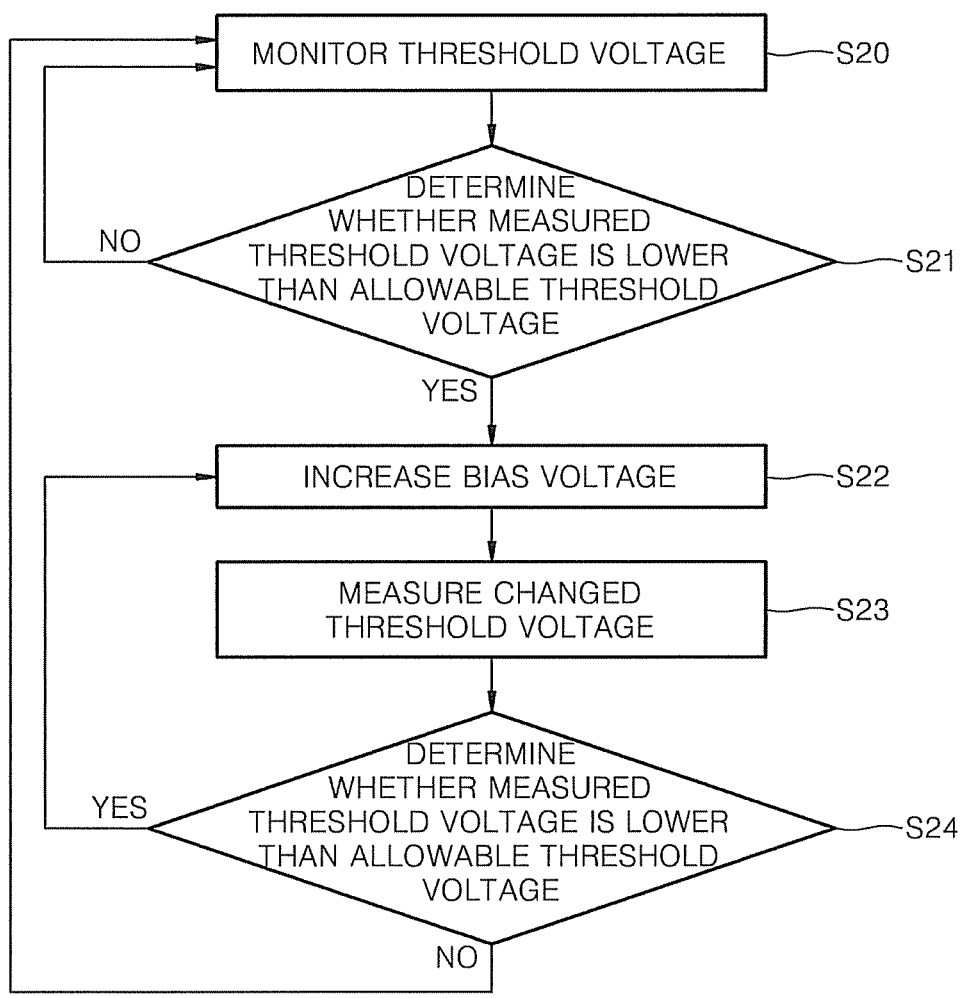
FIG. 12 is a flowchart illustrating a method of adjusting a bias voltage to apply an appropriate negative bias voltage to the light-shielding film, according to another example embodiment.

The negative bias voltage may be adjusted by actually measuring the threshold voltage of the switch transistor 130. FIG. 12 is a flowchart illustrating a method of adjusting a negative bias voltage applied to the light-shielding film 114 by directly measuring a threshold voltage of the switch transistor 130, according to another example embodiment. Referring to FIG. 12, while the light-sensing apparatus 200 or 200' operates, in operation S20, the first gate driver 210 or 210' measures a threshold voltage of the switch transistor 130. For example, the first gate driver 210 or 210' may measure a threshold voltage of the switch transistor 130 in real time. However, since a threshold voltage shift of the switch transistor 130 occurs slowly over a long time, a threshold voltage may be measured at preset time intervals. Also, threshold voltages of all of the switch transistors 130 in the light-sensing apparatus 200 or 200' do not have to be measured, and threshold voltages of only a desired (and/or alternatively preselected) number of (e.g., 3 to 12) switch transistors 130 may be measured.

In operation S21, the first gate driver 210 or 210' determines whether the threshold voltage of the switch transistor 130 is out of an allowable range. As described above, data about a reference threshold voltage may be stored in the memory of the first gate driver 210 or 210'. The first gate driver 210 or 210' compares the measured threshold voltage with the reference threshold voltage. If the measured threshold voltage is lower than the reference threshold voltage, the method proceeds to operation S22. In operation S22, a negative bias voltage applied to the light-shielding film 114 is increased. An increased amount of a bias voltage may be determined by referring to related data of FIG. 10, which is previously stored in the memory. Alternatively, a bias voltage may be increased by a preset amount. In operation S23, a changed threshold voltage of the switch transistor 130 is measured again. In operation S24, the changed threshold voltage of the switch transistor 130 is compared with the reference threshold voltage. If the threshold voltage is still out of the allowable range, the method returns to operation S22. In operation S22, the negative bias voltage applied to the light-shielding film 114 is increased again. In this way, until the threshold voltage of the switch transistor 130 is within the allowable range, that is, until the threshold voltage of the switch transistor 130 is equal to or higher than the reference threshold voltage, operations S22 through operation S24 may be repeatedly performed.

While some example embodiments have been particularly shown and described, it will be understood by one of ordinary skill in the art that variations in form and detail may be made therein without departing from the spirit and scope of the claims.

What is claimed is:

1. A light-sensing apparatus comprising:
   an array of light-sensing pixels, each of the light-sensing pixels including,
      a light sensor transistor configured to sense light,
      a switch transistor configured to output a light-sensing signal from the light sensor transistor, and
      a conductive light-shielding film on a light-incident surface of the switch transistor;
   a first gate driver configured to provide a gate voltage and a negative bias voltage to each of the light-sensing pixels; and
   a signal output unit configured to receive the light-sensing signal from each of the light-sensing pixels,
      the signal output unit being configured to output a data signal.

2. The light-sensing apparatus of claim 1, wherein the first gate driver comprises:
   a gate line that is connected to a gate electrode of the switch transistor in at least one of the light-sensing pixels,
      the gate line being configured to apply the gate voltage to the gate electrode, and
   a bias line that is connected to the conductive light-shielding film in at least one of the light-sensing pixels, the bias line being configured to apply the negative bias voltage to the conductive light-shielding film.

3. The light-sensing apparatus of claim 2, wherein
the array of light-sensing pixels includes the light-sensing pixels arranged in columns and rows,
the first gate driver includes a plurality of the gate lines that are arranged in a row direction, and
each of the gate lines is configured to provide the gate voltage to the light-sensing pixels that are arranged along the same row.

4. The light-sensing apparatus of claim 3, wherein the first gate driver includes:
a plurality of bias lines that are arranged in the row direction, and
each of the bias lines is configured to provide the negative bias voltage to the light-sensing pixels that are arranged along the same row.

5. The light-sensing apparatus of claim 2, wherein
the first gate driver is configured to simultaneously provide the same negative bias voltage to all of the light-sensing pixels.

6. The light-sensing apparatus of claim 1, further comprising:
a second gate driver configured to provide a reset signal to each of the light-sensing pixels.

7. The light-sensing apparatus of claim 6, wherein the second gate driver includes:
a reset line that is connected to a gate electrode of the light sensor transistor in at least one of the light-sensing pixels,
the reset line being configured to provide a reset signal to at least one of the light-sensing pixels.

8. The light-sensing apparatus of claim 7, wherein
the array of light-sensing pixels includes the light-sensing pixels arranged in columns and rows,
the second gate driver includes a plurality of reset lines that are arranged in a row direction, and
each of the reset lines is configured to provide a reset signal to the plurality of light-sensing pixels that are arranged along the same row.

9. The light-sensing apparatus of claim 1, wherein
the light sensor transistor includes a channel film containing an oxide semiconductor material, and
the switch transistor includes a channel film containing an oxide semiconductor material.

10. The light-sensing apparatus of claim 9, wherein
the channel film of the light sensor transistor and the channel film of the switch transistor include the same oxide semiconductor material.

11. The light-sensing apparatus of claim 9, wherein the oxide semiconductor material of at least one of the channel film of the light sensor transistor and the channel film of the switch transistor includes:
at least one of ZnO, InO, SnO, InZnO, ZnSnO, InSnO, and combinations thereof; and
at least one of hafnium (Hf), zirconium (Zr), titanium (Ti), tantalum (Ta), gallium (Ga), niobium (Nb), vanadium (V), aluminum (Al), and stannum (Sn).

12. The light-sensing apparatus of claim 1, wherein each of the light-sensing pixels includes:
a substrate;
a first gate electrode and a second gate electrode at least partially on the substrate;
a gate insulating film on the substrate to cover the first and second gate electrodes;
a first channel film on the gate insulating film and the first gate electrode;
a second channel film on the gate insulating film and the second gate electrode;
a first source/drain electrode that is on a first side surface of the first channel film;
a second source/drain electrode that is between a second side surface of the first channel film and a first side surface of the second channel film;
a third source/drain electrode that is on a second side surface of the second channel film; and
a transparent insulating layer that covers the first through third source/drain electrodes and the first and second channel films.

13. The light-sensing apparatus of claim 12, wherein
the light sensor transistor includes,
the first gate electrode,
a first portion of the gate insulating film,
the first channel film,
the first source/drain electrode,
a first portion of the second source/drain electrode, and
a first portion the transparent insulating layer; and
the switch transistor includes,
the second gate electrode,
a second portion the gate insulating film,
the second channel film,
a second portion of the second source/drain electrode,
the third source/drain electrode, and
a second portion of the transparent insulating layer.

14. The light-sensing apparatus of claim 12, wherein
the light-shielding film is at least partially on the transparent insulating layer to cover the second channel film.

15. The light-sensing apparatus of claim 1, wherein the first gate driver is configured to adjust the negative bias voltage of at least one of the light-sensing pixels based on
previously measured data about a relationship between an operating time of the light-sensing apparatus and a threshold voltage of the switch transistor,
data about a reference threshold voltage of the switch transistor, and
previously measured data about a relationship between a negative bias voltage applied to the light-shielding film and the threshold voltage of the switch transistor.

16. The light-sensing apparatus of claim 1, wherein each of the light-sensing pixels includes:
a common electrode connecting a channel film of the light sensor transistor to a channel film of the switch transistor.

17. The light-sensing apparatus of claim 1, wherein each of the light-sensing pixels includes:
a first gate electrode in the light sensor transistor;
a channel film of the light sensor transistor on the first gate electrode;
a second gate electrode in the switch transistor; and
a channel film of the switch transistor between the second gate electrode and the conductive light-shielding film.

18. The light-sensing apparatus of claim 17, wherein at least one of the channel film of the light sensor transistor and the channel film of the switch transistor includes:
a lower channel film,
an upper channel film, and
an intermediate channel film between the lower channel film and the upper channel film.

19. The light-sensing apparatus of claim 18, wherein at least one of the lower channel film and the upper channel film includes:
an oxide semiconductor material, and
at least one of a group III, IV, XIII, and XIV element.

20. The light-sensing apparatus of claim 1, wherein
the array of light-sensing pixels includes the light-sensing pixels arranged in columns and rows,
the signal output unit includes a plurality of data lines arranged in a column direction, and
each of the data lines are connected to all of the light-sensing pixels arranged along the same column.

21. A method of driving a light-sensing apparatus including a switch transistor configured to output a light-sensing signal from a light-sensing pixel, and a conductive light-shielding film disposed to face the switch transistor, the method comprising:
operating the light-sensing apparatus;
determining whether a threshold voltage of the switch transistor is lower than a reference threshold voltage; and
if it is determined that the threshold voltage is lower than the reference threshold voltage, applying a negative bias voltage to the conductive light-shielding film to shift the threshold voltage of the switch transistor in a positive direction.

22. The method of claim 21, wherein
the negative bias voltage is applied to the light-shielding film when a gate voltage is applied to the switch transistor, and
the application of the negative voltage to the light-shielding film is stopped when the application of the gate voltage to the switch transistor is stopped.

23. The method of claim 22, wherein
the light-sensing apparatus includes an array of light-sensing pixels that are arranged in columns and rows, and
the gate voltage and the negative bias voltage are sequentially provided to the switch transistors and the light-shielding films in the plurality of light-sensing pixels on a row-by-row basis, respectively.

24. The method of claim 21, wherein
a negative bias voltage is continuously applied to the light-shielding film while the light-sensing apparatus operates.

25. The method of claim 21, wherein the determining of whether the threshold voltage of the switch transistor is lower than the reference threshold voltage comprises:
monitoring an operating time of the light-sensing apparatus;
predicting a threshold voltage of the switch transistor by referring to previously measured data about a relationship between the operating time of the light-sensing apparatus and the threshold voltage of the switch transistor; and
comparing the predicted threshold voltage with a reference threshold voltage.

26. The method of claim 21, wherein the determining of whether the threshold voltage of the switch transistor is lower than the reference threshold voltage comprises:
measuring a threshold voltage of the switch transistor while the light-sensing apparatus operates; and
comparing the measured threshold voltage with a reference threshold voltage.

27. The method of claim 26, wherein the measuring of the threshold voltage includes:
measuring a threshold voltage at preset time intervals.

28. The method of claim 26, wherein the measuring of the threshold voltage measures the threshold voltage using a first gate driver of the light-sensing apparatus.

29. The method of claim 21, wherein the applying the negative bias voltage to the conductive light-shielding film to shift the threshold voltage of the switch transistor in the positive direction comprises:
adjusting a negative bias voltage based on previously measured data about a relationship between the negative bias voltage applied to the light-shielding film and the threshold voltage of the switch transistor.

30. The method of claim 21, wherein the applying of the negative bias voltage to the conductive light-shielding film to shift the threshold voltage of the switch transistor in the positive direction comprises:
(a) increasing a negative bias voltage by a preset amount and applying the increased negative bias voltage to the conductive light-shielding film;
(b) determining whether the threshold voltage of the switch transistor is lower than the reference threshold voltage; and
repeating steps (a) and (b) until the threshold voltage of the switch transistor is equal to or higher than a reference threshold voltage.

31. The method of claim 21, wherein
the switch transistor includes a channel film containing an oxide semiconductor material.

32. The method of claim 31, wherein the oxide semiconductor material includes:
at least one of ZnO, InO, SnO, InZnO, ZnSnO, InSnO, and combinations thereof; and
at least one of Hf, Zr, Ti, Ta, Ga, Nb, V, Al, Ga, and Sn.

33. The method of claim 21, wherein the applying a negative bias voltage to the conductive light-shielding film includes:
applying a negative bias voltage to the conductive light-shielding film using a first gate driver of the light-sensing apparatus.

34. The method of claim 21, wherein
the light-sensing apparatus includes a plurality of switch transistors; and the method further includes,
measuring a threshold voltage of some of the plurality of switch transistors while the light-sensing apparatus operates, and
comparing the measured threshold voltages with at least one reference threshold voltage, and
if it is determined that at least one of the measured threshold voltages is lower than the reference threshold voltage, applying a negative bias voltage to the conductive light-shielding film of at least one of the plurality of switch transistors to shift the threshold voltage of at least one of the plurality of switch transistor in a positive direction.

* * * * *